United States Patent
Liu et al.

(10) Patent No.: US 7,656,671 B2
(45) Date of Patent: Feb. 2, 2010

(54) EXPANSION MODULE AND SYSTEM THEREOF

(75) Inventors: Kuo-Hsien Liu, Sindian (TW);
Lung-Ching Lu, Sijhih (TW);
Chih-Hua Lin, Banciao (TW);
Lung-Chi Lu, Sijhih (JP)

(73) Assignee: Axiomtek Co., Ltd., Taipei Hsien (TW)

( * ) Notice: Subject to any disclaimer, the term of this patent is extended or adjusted under 35 U.S.C. 154(b) by 92 days.

(21) Appl. No.: 11/987,287

(22) Filed: Nov. 29, 2007

(65) Prior Publication Data

US 2009/0141458 A1    Jun. 4, 2009

(51) Int. Cl.
*H05K 7/00* (2006.01)

(52) U.S. Cl. .................. 361/735; 361/752; 361/790

(58) Field of Classification Search .................. 361/600, 361/679, 735, 736, 748, 760, 752, 790; 439/55, 439/59–60, 76.1
See application file for complete search history.

(56) References Cited

U.S. PATENT DOCUMENTS

| 4,401,351 A | * | 8/1983 | Record | 439/61 |
| 4,558,914 A | * | 12/1985 | Prager et al. | 439/259 |
| 4,790,762 A | * | 12/1988 | Harms et al. | 439/59 |
| 5,677,830 A | * | 10/1997 | Nogas et al. | 361/790 |
| 5,825,618 A | * | 10/1998 | Schnoor et al. | 361/679.6 |
| 5,949,644 A | * | 9/1999 | Park | 361/679.32 |
| 6,640,235 B1 | * | 10/2003 | Anderson | 708/100 |

\* cited by examiner

*Primary Examiner*—Hung S Bui
(74) *Attorney, Agent, or Firm*—Rosenberg, Klein & Lee

(57) ABSTRACT

An expansion module includes a housing, at least one first wedging device, a connecting device, and a module socket. At one side of the housing, there is at least one plugging pin. The first wedging device is located in the housing. The first wedging device corresponds to the plugging pin. The connecting device has a first connecting portion and a second connecting portion. The first connecting portion is electrically connected with the second connecting portion, and the first connecting portion and the second connecting portion are located at the two opposite sides of the housing. The module socket is located in the housing. The module socket is electrically connected with the connecting device. The user can easily uninstalled or installed the expansion module, the time is reduced, and it prevents the plugging pins of the module card from being damaged due to external force.

12 Claims, 7 Drawing Sheets

EXPANSION MODULE AND SYSTEM THEREOF

BACKGROUND OF THE INVENTION

1. Field of the Invention

The present invention relates to an expansion module and a system thereof. In particular, this invention relates to an expansion module and a system thereof that can be applied to a computer. The user can easily and rapidly disassemble or assemble the module card. The time is reduced, and it can prevent the plugging pins of the module card from being damaged due to the external force.

2. Description of the Related Art

As the technology has been improved, a variety of peripherals for the computer are developed. Therefore, the output/input ports of the computer are inadequate, and a lot of module cards with an expansion function are developed.

Reference is made to FIG. 1, which shows a computer host. The computer host includes a housing 1a, a motherboard 2a, and a plurality of module cards 3a. The housing 1a has a plurality of output/input ports 11a. The motherboard 2a is located in the housing 1a. On the motherboard 2a, there is a plurality of module cards 3a. The modules cards are individually connected with the corresponding output/input ports 11a via a connecting wire (not shown in the figure). The output/input ports 11a are plugged with a variety of electronic peripherals. Each of the module cards 3a has a socket 31a, four licking holes 32a, and a plurality of plugging pins 33a. The socket 31a and the plugging pins 33a are located at the two opposite side surfaces of the module card 3a. The socket 31a corresponds to the plugging pins 33a. The four locking holes 32a are located at the four corners of the module card 3a. At the upper side and the lower side of the locking holes 32a, there is a plurality of screws 4a and bolts 5a to lock the module card 3a onto the motherboard 2a or another module card 3a.

However, the installation of the module card 3a is restricted by the dimension of the housing 1a and the locations of the output/input ports 11a. It is inconvenient for the user to disassemble the module cards, and is time-consuming. When the module card 3a is uninstalled or installed, the plugging pins 33a of the module card 3a easily be bent or broken due to the external force.

SUMMARY OF THE INVENTION

One particular aspect of the present invention is to provide an expansion module and a system thereof. When the module card is uninstalled or installed, it can prevent the plugging pins of the module card from being damaged due to the external force. It is also reduces the uninstalling or installing time.

The expansion module includes a housing having at least one plugging pin at one side of the housing, at least one first wedging device located in the housing, a connecting device having a first connecting portion and a second connecting portion, and a module socket located in the housing. The first wedging device corresponds to the plugging pin. The first connecting portion is electrically connected with the second connecting portion, and the first connecting portion and the second connecting portion are located at the two opposite sides of the housing. The module socket is electrically connected with the connecting device.

In an embodiment, the present invention also provides an expansion module system. The expansion module system includes a host body having at least one second wedging device and a third connecting portion, and at least one expansion module located at the host body and electrically connected with the host body. The expansion module includes a housing, at least one first wedging device, a connecting device, and a module socket. At one side of the housing, there is at least one plugging pin. The first wedging device is located in the housing. The first wedging device corresponds to the plugging pin. The connecting device has a first connecting portion and a second connecting portion. The first connecting portion is electrically connected with the second connecting portion, and the first connecting portion and the second connecting portion are located at the two opposite sides of the housing. The module socket is located in the housing. The module socket is electrically connected with the connecting device. The plugging pin is plugged into the second wedging device, and the second connecting portion is electrically connected with the third connecting portion.

The present invention has the following characteristics:

1. The present invention installs the module socket in the housing of the expansion module, and uses the module socket to electrically connect with the connecting device. Thereby, the module socket can be plugged with a module card. Therefore, when the user wishes to uninstall or install the module card, the user merely needs to uninstall or install the expansion module. It can prevent the plugging pins of the module card from being deformed or broken due to the external force.

2. Because the plugging pin corresponds to the first wedging device and the second wedging device, the module card is easily uninstalled or installed. The time is reduced.

3. The present invention has an external expansion module. Therefore, the module card is not restricted due to the dimension of the host body, and it does not need to install the output/input ports on the host body. The expansion module can be plugged with the electronic peripherals according to the user's requirements.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
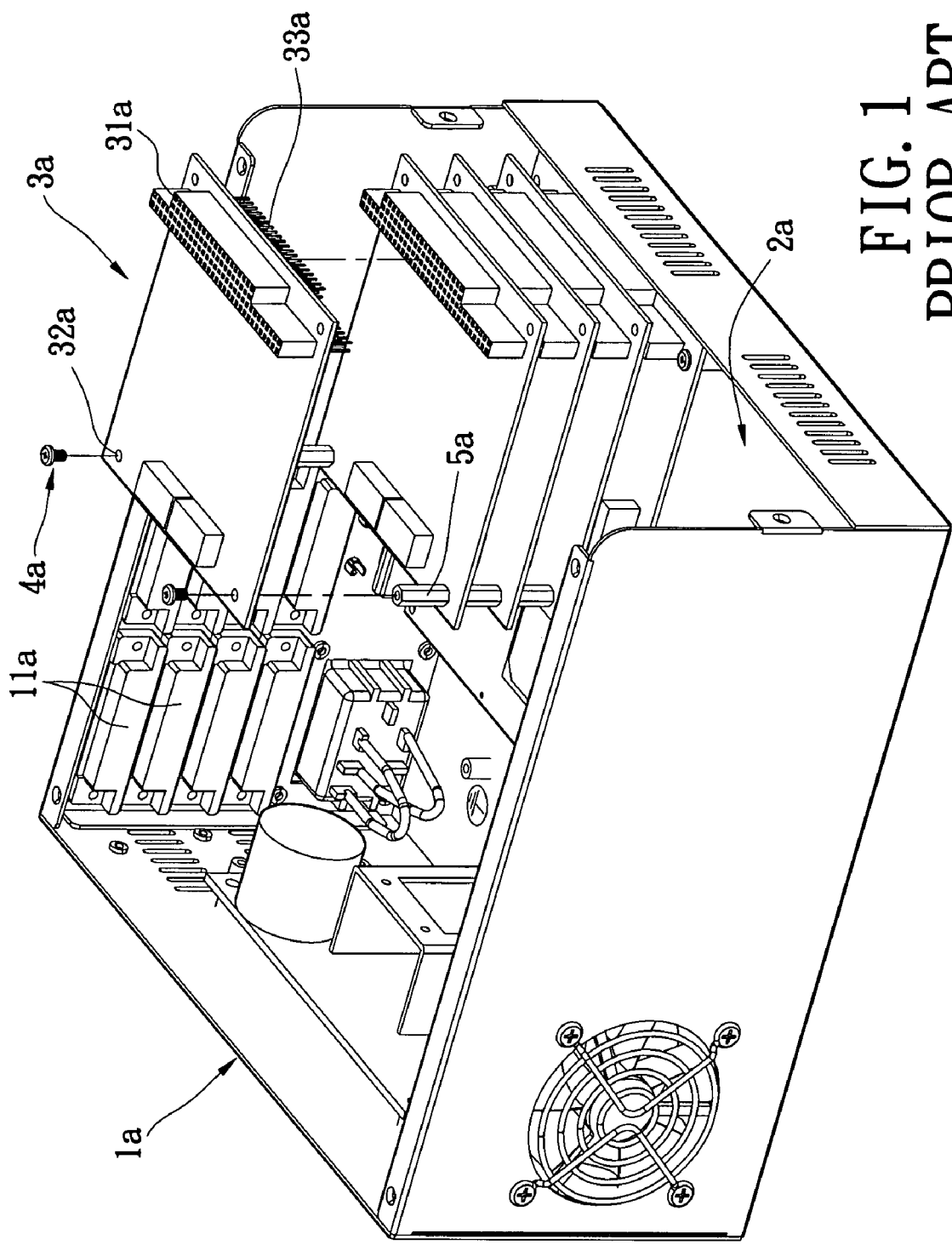
FIG. 1 is a perspective view of the expansion module and a system thereof of the prior art.
Figure 2:
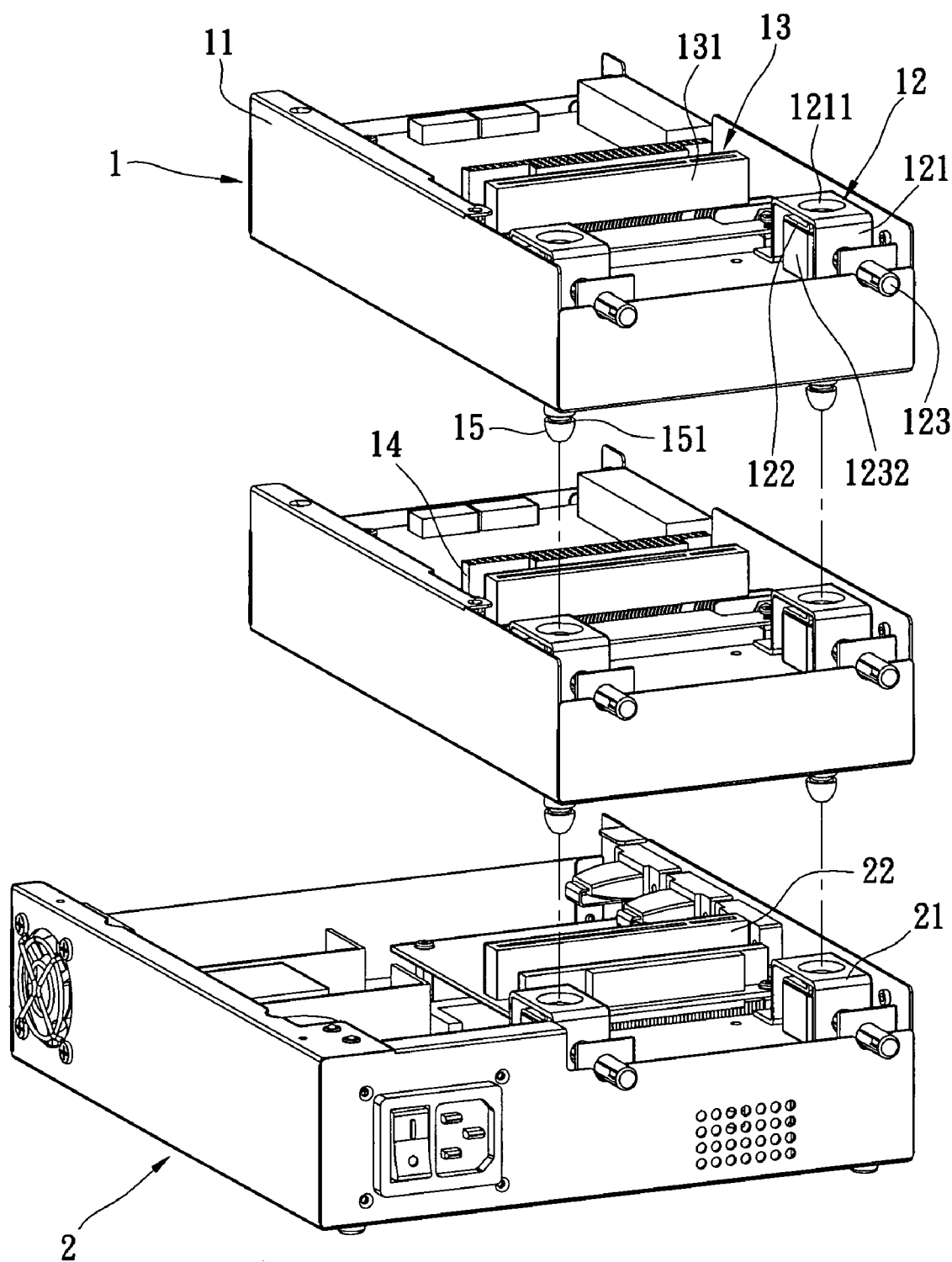
FIG. 2 is an exploded perspective view of the expansion module and a system thereof of the present invention.
Figure 3:
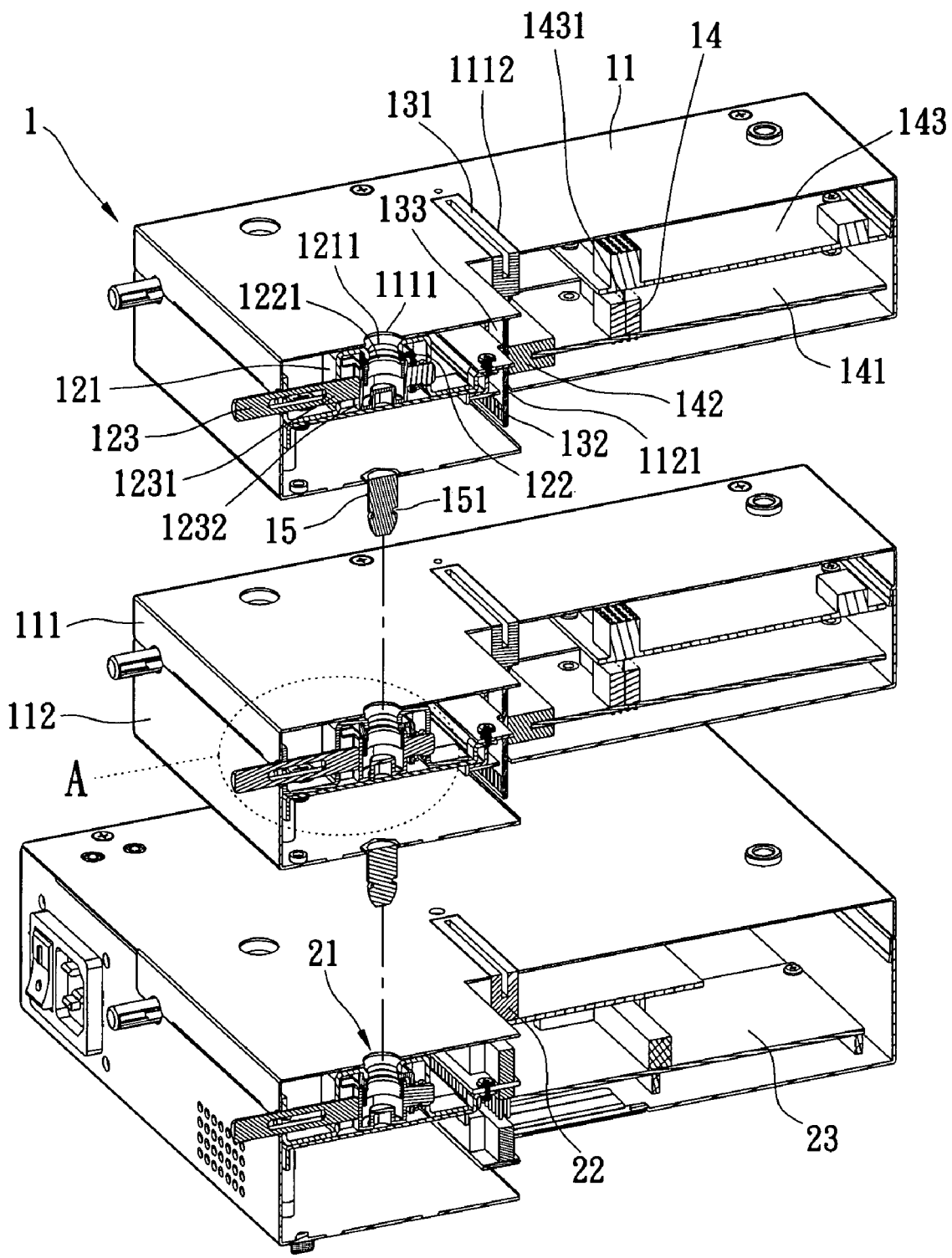
FIG. 3 is a cross-sectional view of the expansion module and a system thereof of the present invention.
Figure 3A:
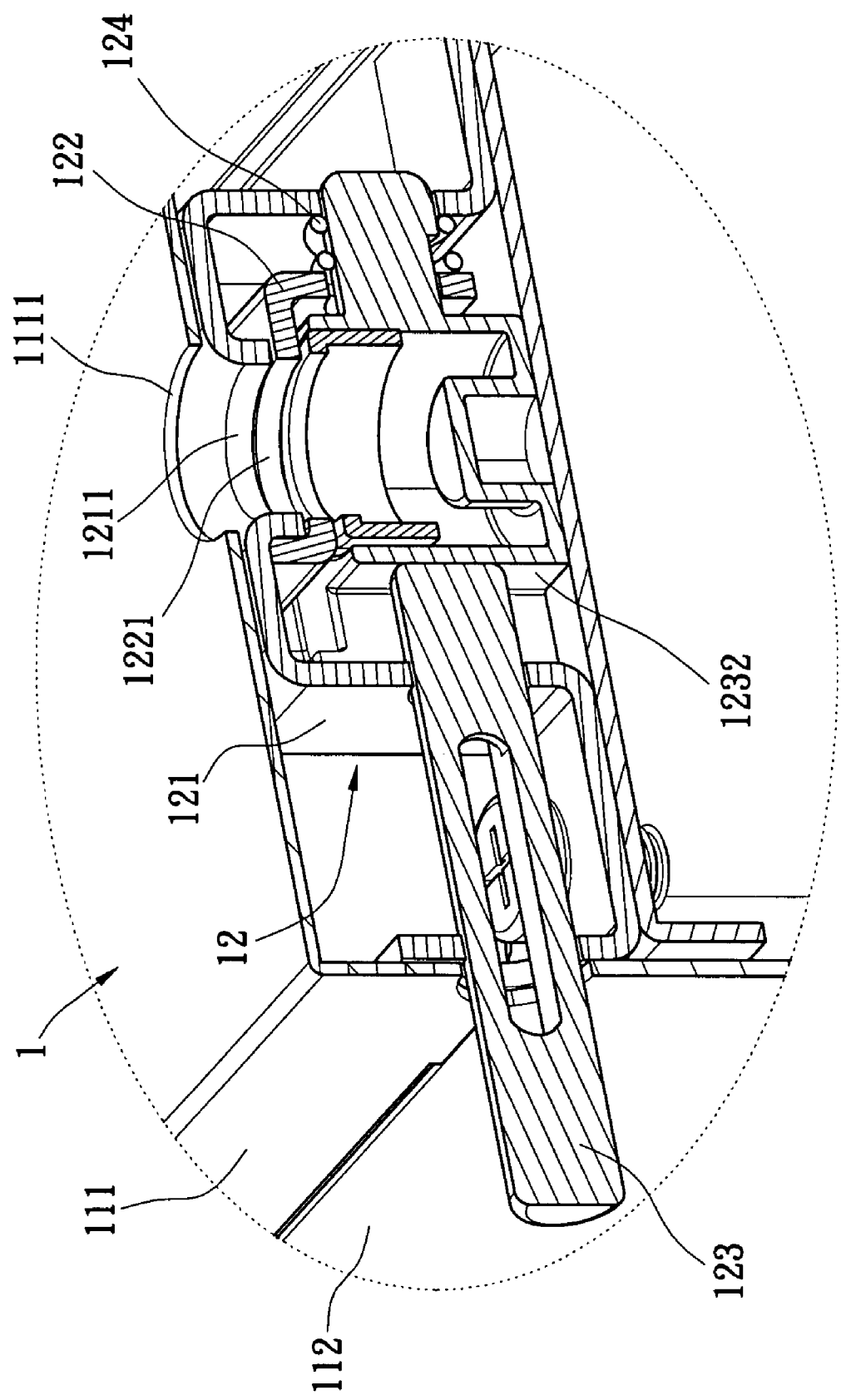
FIG. 3A is a cross-sectional view of part of the expansion module of the present invention.
Figure 4:
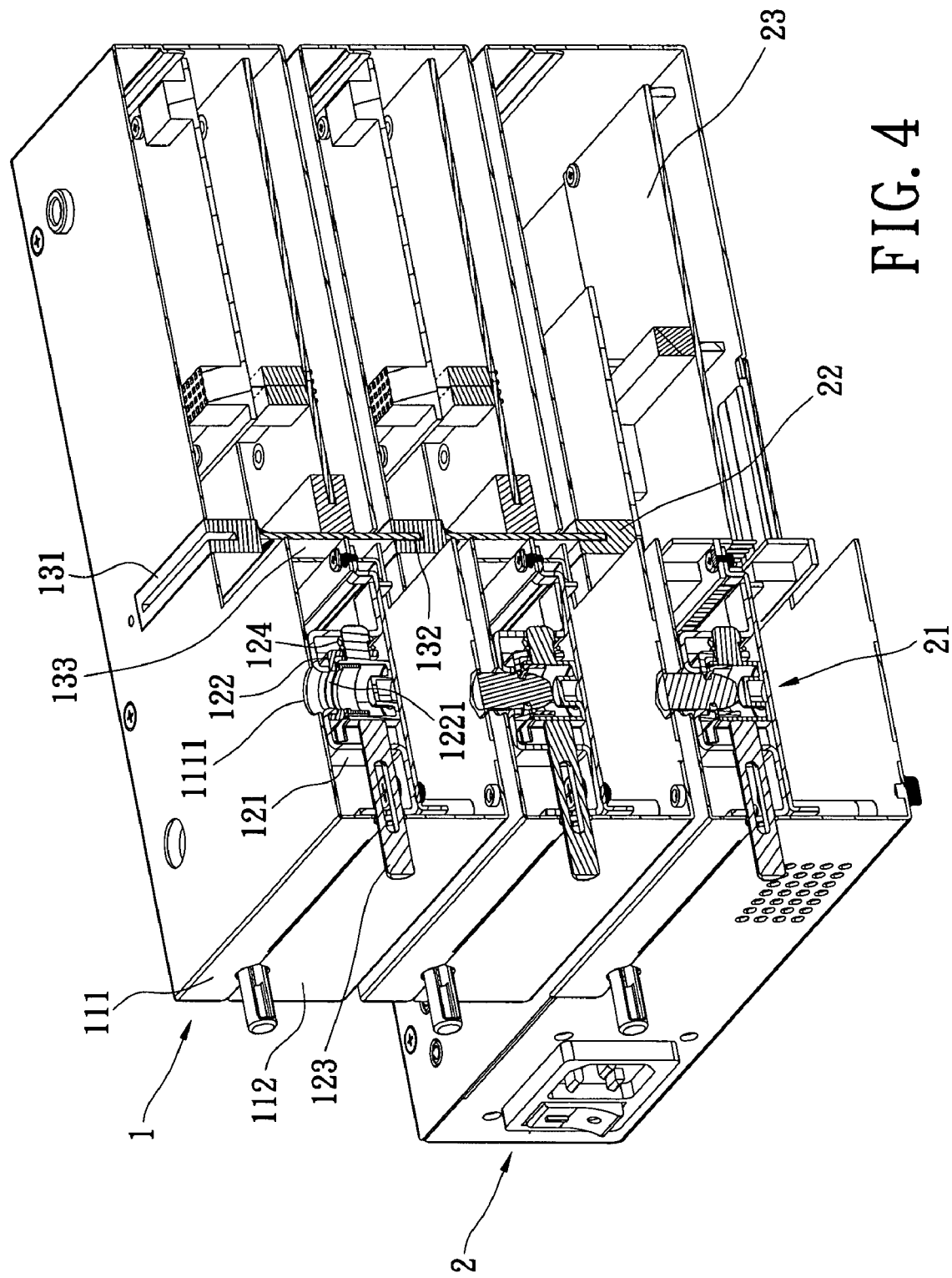
FIG. 4 is a cross-sectional view of the expansion module of the present invention assembling with the expansion module system.
Figure 5:
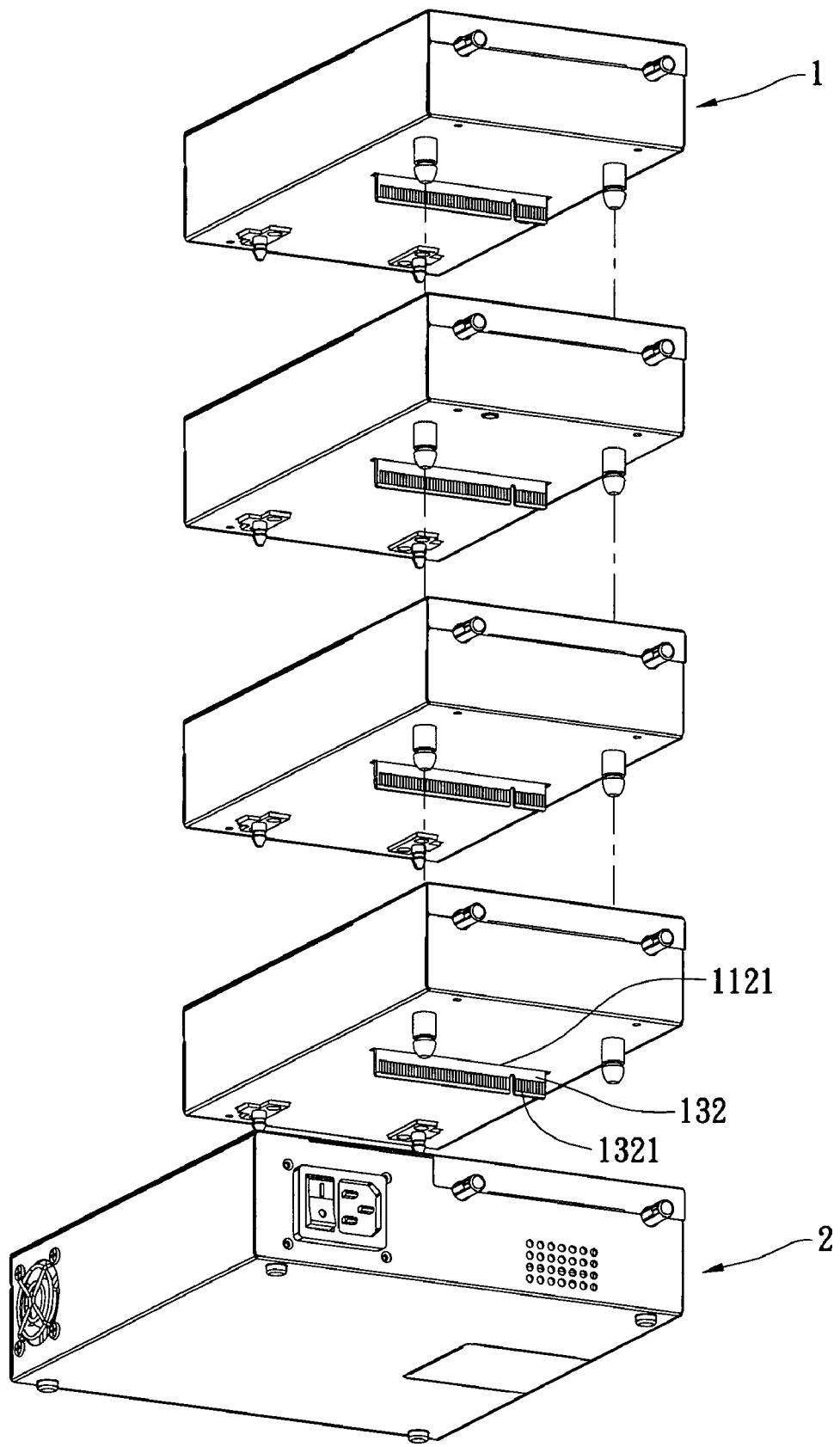
FIG. 5 is a schematic diagram of the assembling process of the expansion module of the present invention assembling with the expansion module system.
Figure 6:
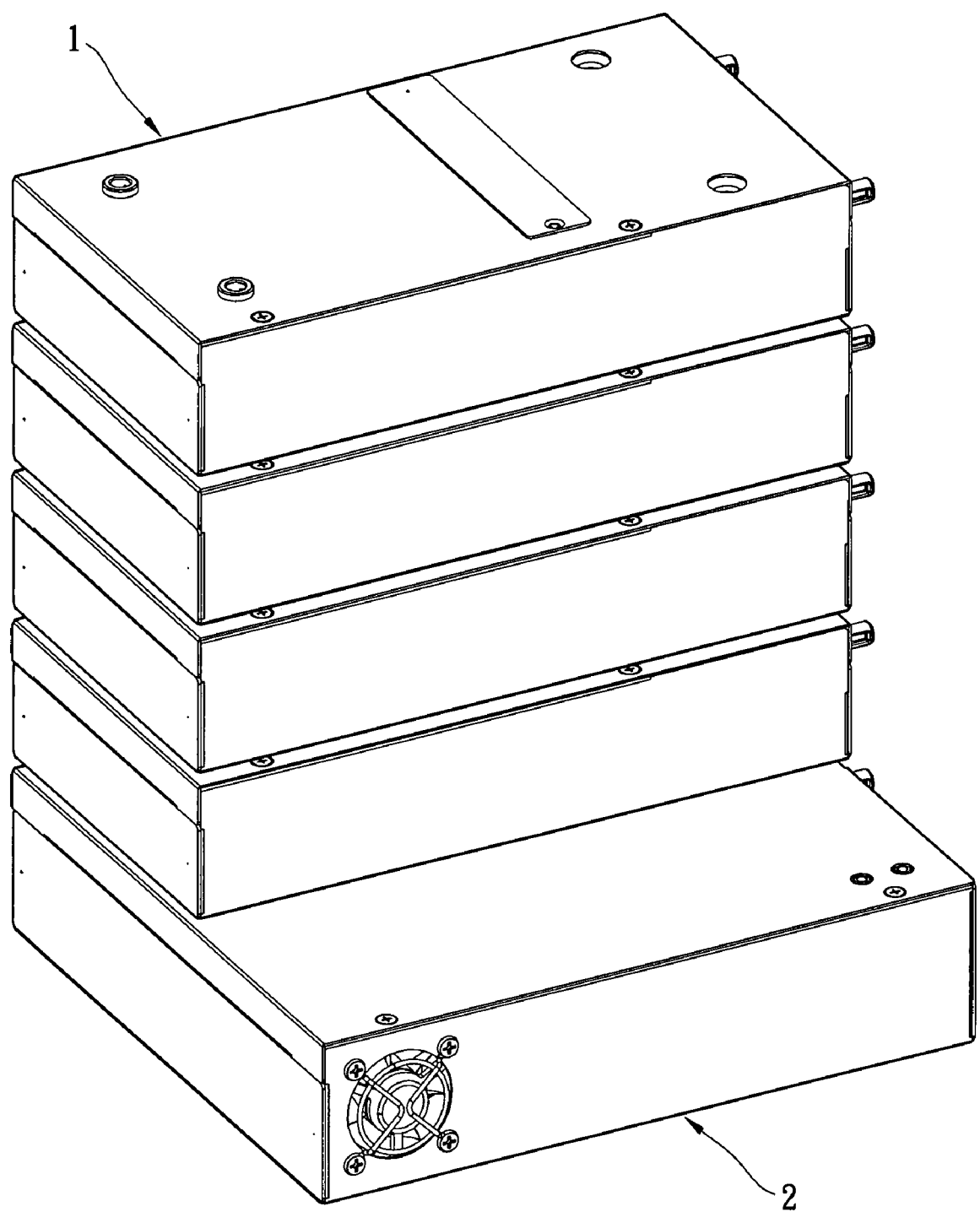
FIG. 6 is a perspective view of the expansion module of the present invention assembling with the expansion module system.

Reference is made to FIGS. 3~6. The present invention provides an expansion module and a system thereof. The expansion module 1 includes a housing 11, at least one first wedging device 12, a connecting device 13, and a module socket 14. The housing 11 is a square and hollow housing. The housing 11 has an upper cover 111, and a lower cover 112. The upper cover 111 has a first through hole 1111 that corresponds to the first wedging device 12. The upper cover 111 has a first opening 1112 that corresponds to the connecting device 13. The lower cover 112 has a second opening 1121 that corresponds to the connecting device 13. The upper cover 111 is screwed to the lower cover 112 via screws. In this embodiment, at the bottom of the housing 11, there are two plugging pins 15. The number of the plugging pins in not limited to two. The shape of the plugging pin 15 is column. A circular wedging slot 151 is formed at the bottom of the plugging pin 15.

The first wedging device 12 corresponds to the plugging pin 15. In this embodiment, there are two first wedging devices 12. The first wedging device 12 is located in the housing 11. The first wedging device 12 includes a fastening part 121, a wedging part 122, a pressing part 123, and a flexible part 124. The fastening part 121 is a rectangular bent metal flake. The two ends of the fastening part 121 are screwed into the housing 11 via screws. The fastening part 121 has a first plugging hole 1211. The wedging part 122 is a bent metal flake. The wedging part 122 is located below the fastening part 121. The wedging part 122 has a second plugging hole 1221. The second plugging hole 1221 corresponds to the first plugging hole 1211. The second plugging hole 1221 corresponds to the circular wedging slot 151. The pressing part 123 is composed of a pushing rod 1231 and a pushing block 1232. The pushing block 1232 is hollow. The pushing rod 1231 located at one side of the pushing block 1232 passes through the wedging part 122 and the fastening part 121. The pushing rod 1231 located at another side of the pushing block 1232 passes through the fastening part 121 and the housing 11. The pressing part 123 is movably located below the wedging part 122. In this embodiment, the flexible part 124 is a spring. The flexible part 124 also can be other flexible body. The flexible part 124 is sleeved at one side of the pushing rod 1231. The flexible part 124 is clipped between the fastening part 121 and the wedging part 122.

The connecting device 13 has a first connecting portion 131 and a second connecting portion 132. In this embodiment, the first connecting portion 131 is a plugging slot, and the second connecting portion 132 is a gold finger. The first connecting portion 131 is located at the top of a circuit board 133. The circuit board 133 is vertically located in the housing 11. The second connecting portion 132 is located at the bottom of the circuit board 133. The second connecting portion 132 protrudes to outside of the second opening 1121 of the lower cover 112. The second connecting portion 132 has a conducting trace 1321 that corresponds to the first connecting portion 131.

The module socket 14 is located in the housing 11. In this embodiment, the module socket 14 is located on an expansion card 141. The expansion card 141 is plugged into an expansion slot 142. The expansion slot 142 is located at one side of the first connecting portion 131. The expansion slot 142 is electrically connected with the first connecting portion 131 and the second connecting portion 132. The module socket 14 is plugged with a module card 143 so that the module card 143 is electrically connected with the connecting device 13.

The expansion module system includes a host body 2, and at least one expansion module 1. In this embodiment, the host body 2 has two second wedging devices 21 and a third connecting portion 22. The structure of the second wedging device 21 is the same as one of the first wedging device 12. The third connecting portion 22 is a plugging slot. The third connecting portion 22 is the same as the first connecting portion 131. The third connecting portion 22 corresponds to the second connecting portion 132. The third connecting portion 22 is plugged onto a motherboard 23. The two second wedging devices 21, the third connecting portion 22 and the motherboard 23 are located in the host body 2. The plugging pin 15 of the expansion module 1 is plugged into the second wedging device 21, the second connecting portion 132 is plugged into the third connecting portion 22, and the second connecting portion 132 is electrically connected with the third connecting portion 22.

When the expansion module 1 is assembled, the plugging pin 15 of the expansion module 1 is plugging into the first wedging device 12 of another expansion module 1, or the plugging pin 15 of the expansion module 1 is plugging into the second wedging device 21 of the host body 2. The second connecting portion 132 is plugging into the first connecting portion 131 of another expansion module 1, or the second connecting portion 132 is plugging into the third connecting portion 22 of the host body 2. The dimension of the first through hole 1111 is slightly larger than the dimension of the plugging pin 15. The plugging pin 15 passes through the first through hole 1111, and then passes through the first plugging hole 1211 and the second plugging hole 1221 and enters into the pushing block 123. Because the flexible part 124 is clipped between the fastening part 121 and the wedging part 122, the flexible part 124 contacts and pushes the wedging part 122 so that the wedging part 122 contacts and pushes the circular wedging slot 151 due to the flexible force after the plugging pin 15 passes through the second plugging hole 1221.

When the expansion module 1 is disassembled, the pressing part 123 is pressed to make the pushing block 1232 push the wedging part 22 so that the wedging part 22 departs from the circular wedging slot 151. Next, the expansion module 1 is pulled upwards so that the second connecting portion 132 detaches from the first connecting portion 131 of another expansion module 1 or the second connecting portion 132 detaches from the third connecting portion 22 of the host body 2. Thereby, the expansion modules 1 are detached from each other, or the expansion module 1 is detached from the host body 2.

The present invention installs the module socket 14 in the housing 11 of the expansion module 1, and uses the module socket 14 to electrically connect with the connecting device 13. Thereby, the module socket 14 can be plugged with a module card 143. Therefore, when the user wishes to uninstall or install the module card 143, the user merely needs to uninstall or install the expansion module 1. It can prevent the plugging pins 1431 of the module card 143 from being deformed or broken due to the external force.

Because the plugging pin 15 corresponds to the first wedging device 12 and the second wedging device 12, the module card 143 is easily uninstalled or installed. The time is reduced.

The present invention has an external expansion module 1. Therefore, the module card 143 is not restricted due to the dimension of the host body 2, and it does not need to install the output/input ports on the host body. The expansion module 1 can be plugged with the electronic peripherals according to the user's requirements.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An expansion module, comprising:
   a housing having at least one plugging pin at one side of the housing;
   at least one first wedging device located in the housing, wherein the first wedging device corresponds to the plugging pin;
   a connecting device having a first connecting portion and a second connecting portion, wherein the first connecting portion is electrically connected with the second connecting portion, and the first connecting portion and the second connecting portion are located at two opposite sides of the housing; and
   a module socket located in the housing, wherein the module socket is electrically connected with the connecting device, wherein the first wedging device comprises a fastening part, a wedging part, a pressing part, and a flexible part, the fastening part has a first plugging hole, the wedging part has a second plugging hole, the wedging part is located below the fastening part, the pressing part is located below the wedging part, and the flexible part is clipped between the fastening part and the wedging part.

2. The expansion module as claimed in claim 1, wherein the plugging pin has a circular wedging slot.

3. The expansion module as claimed in claim 1, wherein the housing has an upper cover and a lower cover, the upper cover has a first opening, the lower cover has a second opening, the first opening corresponds to the first connecting portion, the second opening corresponds to the second connecting portion, and the upper cover is crewed onto the lower cover via screws.

4. The expansion module as claimed in claim 3, wherein the upper cover has a first through hole that corresponds to the wedging device, and the dimension of the first through hole is slightly larger than the dimension of the plugging pin.

5. The expansion module as claimed in claim 1, wherein the first connecting portion is a plugging slot, the plugging slot is located at a top of a circuit board, the circuit board is vertically located in the housing, the second connecting portion is located at a bottom of the circuit board, the second connecting portion protrudes to outside of the bottom of the housing, and the second connecting portion has a conducting trace that corresponds to the first connecting portion.

6. The expansion module as claimed in claim 1, wherein the module socket is located on an expansion card, the expansion card is plugged into an expansion slot, the expansion slot is located at one side of the first connecting portion, and the expansion slot is electrically connected with the first connecting portion and the second connecting portion.

7. An expansion module system, comprising:
   a host body having at least one second wedging device and a third connecting portion; and
   at least one expansion module located at the host body and electrically connected with the host body, wherein the expansion module includes a housing, at least one first wedging device, a connecting device, and a module socket, there is at least one plugging pin at one side of the housing, the first wedging device is located in the housing, the first wedging device corresponds to the plugging pin, the connecting device has a first connecting portion and a second connecting portion, the first connecting portion is electrically connected with the second connecting portion, the first connecting portion and the second connecting portion are located at two opposite sides of the housing, the module socket is located in the housing, the module socket is electrically connected with the connecting device, the plugging pin is plugged into the second wedging device, and the second connecting portion is electrically connected with the third connecting portion, wherein the first wedging device comprises a fastening part, a wedging part, a pressing part, and a flexible part, the fastening part has a first plugging hole, the wedging part has a second plugging hole, the wedging part is located below the fastening part, the pressing part is located below the wedging part, and the flexible part is clipped between the fastening part and the wedging part.

8. The expansion module system as claimed in claim 7, wherein the plugging pin has a circular wedging slot.

9. The expansion module system as claimed in claim 7, wherein the housing has an upper cover and a lower cover, the upper cover has a first opening, the lower cover has a second opening, the first opening corresponds to the first connecting portion, the second opening corresponds to the second connecting portion, and the upper cover is crewed onto the lower cover via screws.

10. The expansion module system as claimed in claim 9, wherein the upper cover has a first through hole that corresponds to the wedging device, and the dimension of the first through hole is slightly larger than the dimension of the plugging pin.

11. The expansion module system as claimed in claim 7, wherein the first connecting portion is a plugging slot, the plugging slot is located at a top of a circuit board, the circuit board is vertically located in the housing, the second connecting portion is located at a bottom of the circuit board, the second connecting portion protrudes to outside of the bottom of the housing, and the second connecting portion has a conducting trace that corresponds to the first connecting portion.

12. The expansion module system as claimed in claim 7, wherein the module socket is located on an expansion card, the expansion card is plugged into an expansion slot, the expansion slot is located at one side of the first connecting portion, and the expansion slot is electrically connected with the first connecting portion and the second connecting portion.

* * * * *